United States Patent
Shirai et al.

(10) Patent No.: US 9,732,436 B2
(45) Date of Patent: Aug. 15, 2017

(54) SIC SINGLE-CRYSTAL INGOT, SIC SINGLE CRYSTAL, AND PRODUCTION METHOD FOR SAME

(71) Applicants: Takayuki Shirai, Aichi (JP); Katsunori Danno, Aichi (JP)

(72) Inventors: Takayuki Shirai, Aichi (JP); Katsunori Danno, Aichi (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 14/405,543

(22) PCT Filed: Apr. 16, 2013

(86) PCT No.: PCT/JP2013/061274
§ 371 (c)(1),
(2) Date: Dec. 4, 2014

(87) PCT Pub. No.: WO2013/183368
PCT Pub. Date: Dec. 12, 2013

(65) Prior Publication Data
US 2015/0191849 A1 Jul. 9, 2015

(30) Foreign Application Priority Data
Jun. 5, 2012 (JP) ................. 2012-128072

(51) Int. Cl.
*C30B 19/06* (2006.01)
*C30B 9/06* (2006.01)
(Continued)

(52) U.S. Cl.
CPC ............. *C30B 19/062* (2013.01); *C30B 9/00* (2013.01); *C30B 9/06* (2013.01); *C30B 9/10* (2013.01);
(Continued)

(58) Field of Classification Search
CPC ....... C30B 19/062; C30B 29/36; C30B 19/02; C30B 19/10; C30B 19/08; C30B 19/12;
(Continued)

(56) References Cited

U.S. PATENT DOCUMENTS 6,593,209 B2 * 7/2003 Kurtz et al. .................. 438/431
2005/0160965 A1 7/2005 Ohtani et al.
(Continued)

FOREIGN PATENT DOCUMENTS

| CN | 102187019 | 9/2011 |
|---|---|---|
| JP | 6-227886 | 8/1994 |

(Continued)

OTHER PUBLICATIONS

English translation of JP-2009-256155 to Masakazu et al., retrieved from the espacenet website on Dec. 14, 2015.*
Kamei et al., "Solution Growth of Single crystalline 6H, 4H—SiC using Si—Ti—C-melt".*

*Primary Examiner* — Jonathan Langman
(74) *Attorney, Agent, or Firm* — Finnegan, Henderson, Farabow, Garrett & Dunner, LLP

(57) ABSTRACT

Provided are an SiC single-crystal ingot containing an SiC single crystal having a low threading dislocation density and low resistivity; an SiC single crystal; and a production method for the SiC single crystal. The SiC single crystal ingot contains a seed crystal and a grown crystal grown by a solution process in which the seed crystal is the base point, the grown crystal of the SiC single crystal ingot containing a nitrogen density gradient layer in which the nitrogen content increases in the direction of growth from the seed crystal.

6 Claims, 3 Drawing Sheets

(51) Int. Cl.
 *C30B 9/00* (2006.01)
 *C30B 19/04* (2006.01)
 *C30B 29/36* (2006.01)
 *C30B 17/00* (2006.01)
 *C30B 19/02* (2006.01)
 *C30B 19/10* (2006.01)
 *C30B 9/10* (2006.01)
 *C30B 19/08* (2006.01)
 *C30B 19/12* (2006.01)

(52) U.S. Cl.
 CPC .............. *C30B 17/00* (2013.01); *C30B 19/02* (2013.01); *C30B 19/04* (2013.01); *C30B 19/08* (2013.01); *C30B 19/10* (2013.01); *C30B 19/12* (2013.01); *C30B 29/36* (2013.01)

(58) Field of Classification Search
 CPC .. C30B 19/04; C30B 9/10; C30B 9/00; C30B 9/06; C30B 17/00
 See application file for complete search history.

(56) References Cited

U.S. PATENT DOCUMENTS

2011/0206929 A1* 8/2011 Nakabayashi et al. ....... 428/367
2011/0297893 A1 12/2011 Seki et al.
2012/0025153 A1 2/2012 Hirose et al.
2013/0220212 A1 8/2013 Kusunoki et al.

FOREIGN PATENT DOCUMENTS

| JP | 2003-300797 | 10/2003 | |
| JP | 2006-290635 | 10/2006 | |
| JP | 2008-74663 | 4/2008 | |
| JP | 2008-105896 | 5/2008 | |
| JP | 2009-256155 | * 11/2009 | ............. C30B 29/36 |
| JP | 2010-189235 | 9/2010 | |
| JP | 2012-31014 | 2/2012 | |
| WO | WO 2010/095021 | 8/2010 | |
| WO | WO 2012/063743 | 5/2012 | |

* cited by examiner

SIC SINGLE-CRYSTAL INGOT, SIC SINGLE CRYSTAL, AND PRODUCTION METHOD FOR SAME

TECHNICAL FIELD

The present invention relates to a SiC single crystal suitable as a semiconductor element and to a method for its production, and more specifically, it relates to an ingot of SiC single crystal and an SiC single crystal with minimal threading dislocation and low resistivity, produced by a solution process, as well as, and a method for their production.

BACKGROUND ART

SiC single crystals are thermally and chemically very stable, superior in mechanical strengths, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Various strategies have been used in the attempt to develop SiC single crystals that can be used for such purposes. For example, it has been attempted to obtain SiC single crystals with low volume resistivity (hereunder referred to as "resistivity") in order to reduce electric power loss when such SiC single crystals are to be applied in electronic devices, such as power devices. For example, a SiC single crystal is doped with an n-type impurity to reduce the resistivity of the SiC single crystal, and nitrogen may be used as the n-type impurity (PTL 1).

Typical growth processes for growing SiC single crystals that are known in the prior art include gas phase processes, the Acheson process, and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved into the molten liquid, and a SiC crystal layer is deposited and grown on a seed crystal substrate set in the low temperature zone. Solution processes can be expected to reduce defects compared to sublimation processes, since crystal growth is carried out in a state of near thermal equilibrium, compared to gas phase processes. In recent years, therefore, several methods for producing SiC single crystals by solution processes have been proposed, and methods for obtaining SiC single crystals with few crystal defects have also been proposed (PTLs 2 and 3).

CITATION LIST

Patent Literature

[PTL 1] Japanese Unexamined Patent Publication No. 2010-189235
[PTL 2] Japanese Unexamined Patent Publication No. 2008-105896
[PTL 3] Japanese Unexamined Patent Publication HEI No. 6-227886

SUMMARY OF THE INVENTION

Problems to be Solved by the Invention

Thus, attempts have been made to obtain high quality SiC single crystals by solution processes. A new problem has been encountered, however, in that when the nitrogen density in a grown crystal is increased to obtain a SiC single crystal with low resistivity, as in PTL 1, a large degree of threading dislocation tends to be generated in the grown crystal even with a solution process, such that a high-quality crystal cannot be obtained. Another problem has been that it is difficult to lower the resistivity of SiC single crystals in solution processes.

The present invention has been accomplished in light of these circumstances, and its object is to provide an ingot of SiC single crystal and an SiC single crystal having low density of threading dislocations, such as threading screw dislocation and threading edge dislocation, and low resistivity, as well as a method for producing an SiC single crystal by a solution process.

Means for Solving the Problems

The invention is a SiC single crystal ingot comprising a seed crystal and a grown crystal grown from the seed crystal by a solution process,
wherein the grown crystal contains a nitrogen density gradient layer in which the nitrogen content increases in the direction of growth from the seed crystal.

The invention is also a SiC single crystal grown from a seed crystal by a solution process,
wherein the SiC single crystal has a threading dislocation density of $7 \times 10^3/cm^2$ or less, and a resistivity of 10 mΩ·cm or less.

The invention is still further a method for producing a SiC single crystal by a solution process, wherein a SiC seed crystal is contacted with a Si—C solution having a temperature gradient in which the temperature decreases from the interior toward the surface, in a crucible, to grow a SiC single crystal,
wherein the method for producing a SiC single crystal comprises a step of increasing the nitrogen partial pressure in the crucible after contact of the seed crystal with the Si—C solution, to above the nitrogen partial pressure in the crucible before contact of the seed crystal with the Si—C solution.

Effect of the Invention

According to the invention it is possible to obtain a SiC single crystal with low threading dislocation density and low resistivity.

DESCRIPTION OF EMBODIMENTS

Figure 1:
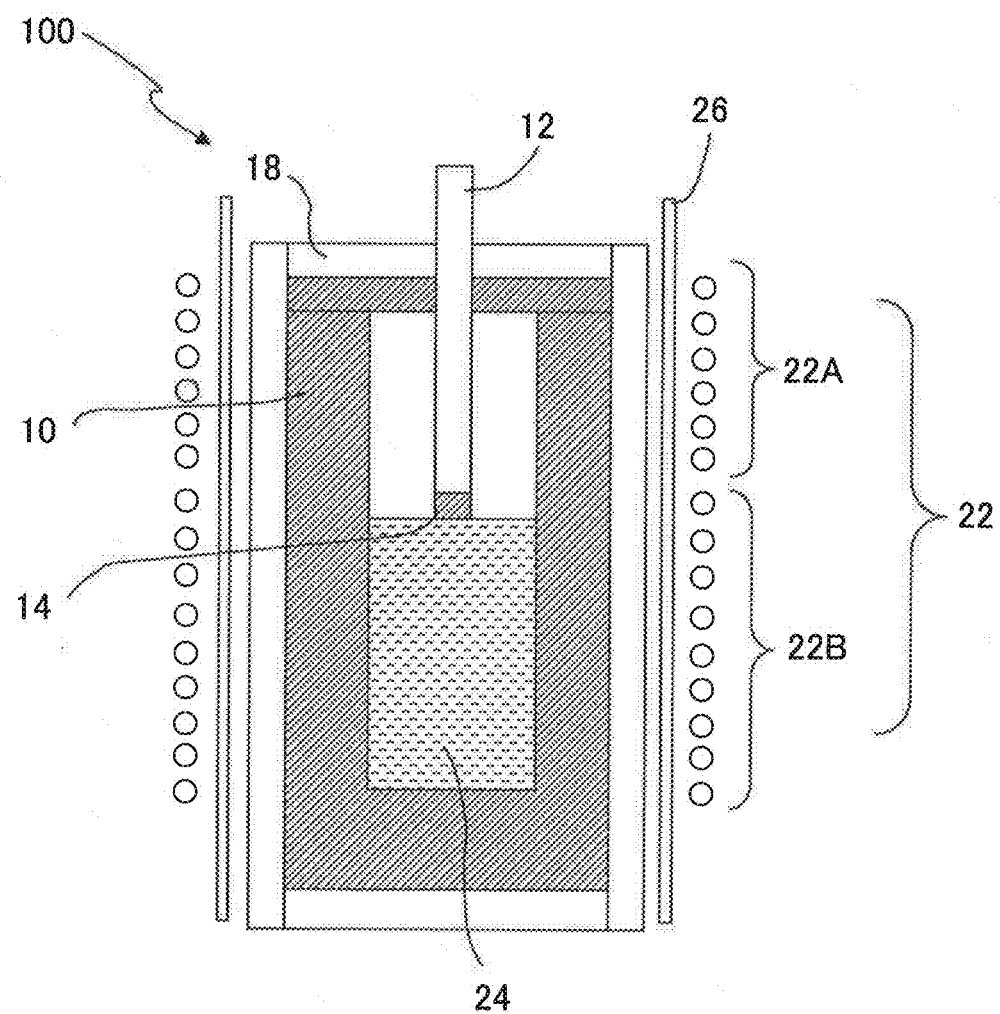
FIG. 1 is a cross-sectional schematic drawing of a single crystal production apparatus based on a solution process, to be used for the invention.

A new problem has been encountered, in that when a SiC single crystal with high nitrogen density and low resistivity is grown from a seed crystal by a solution process, threading dislocation may be generated from the interface between the seed crystal and the grown crystal, producing a large degree of threading dislocation in the grown crystal.

Nitrogen atoms can replace the carbon atom locations of the SiC crystal and function as donors (electron donors). However, since nitrogen atoms have a smaller atomic radius than carbon atoms, doping the SiC crystal with nitrogen causes the lattice constant to shrink. A SiC seed crystal can generally have a nitrogen density on the order of $10^{18}/cm^3$. On the other hand, a SiC grown crystal grown to have low resistivity by increasing nitrogen density may have a nitrogen density of $10^{19}/cm^3$ or greater. Thus, it is believed that since a difference is created between the lattice constant of the seed crystal and the lattice constant of the grown crystal, resulting in distortion of the crystal, threading dislocation is generated in the grown crystal.

It has also been attempted to lower resistivity of SiC single crystals grown by solution processes in the prior art. However, it has been difficult to obtain a SiC single crystal with low resistivity, and it has not been possible to lower resistivity to preferably 10 mΩ·cm or less in a satisfactory manner.

In light of this situation, the present inventors have conducted diligent research on SiC single crystals obtained by solution processes, for high-quality SiC single crystals with low threading dislocation and low resistivity. Throughout the present specification, threading dislocation includes threading screw dislocation and threading edge dislocation.

As a result, they have discovered a SiC single crystal ingot comprising a grown crystal formed by a solution process, wherein the grown crystal comprises a nitrogen density gradient layer.

The invention is a SiC single crystal ingot comprising a seed crystal and a grown crystal grown from the seed crystal by a solution process, wherein the grown crystal contains a nitrogen density gradient layer in which the nitrogen content increases in the direction of growth from the seed crystal.

The grown crystal is a SiC single crystal grown by a solution process using a seed crystal as the origin, and it has a nitrogen density gradient layer with increasing nitrogen density from the seed crystal side toward the growth surface side. This allows threading dislocation density to be reduced in the grown crystal, while also achieving low resistivity.

A solution process is a process for producing a SiC single crystal, wherein a SiC seed crystal is contacted with a Si—C solution having a temperature gradient in which the temperature decreases from the interior toward the surface, to grow a SiC single crystal. By forming a temperature gradient in which the temperature decreases from the interior of the Si—C solution toward the surface of the solution, the surface region of the Si—C solution becomes supersaturated to grow a SiC single crystal from the seed crystal substrate contacting with the Si—C solution.

Figure 4:
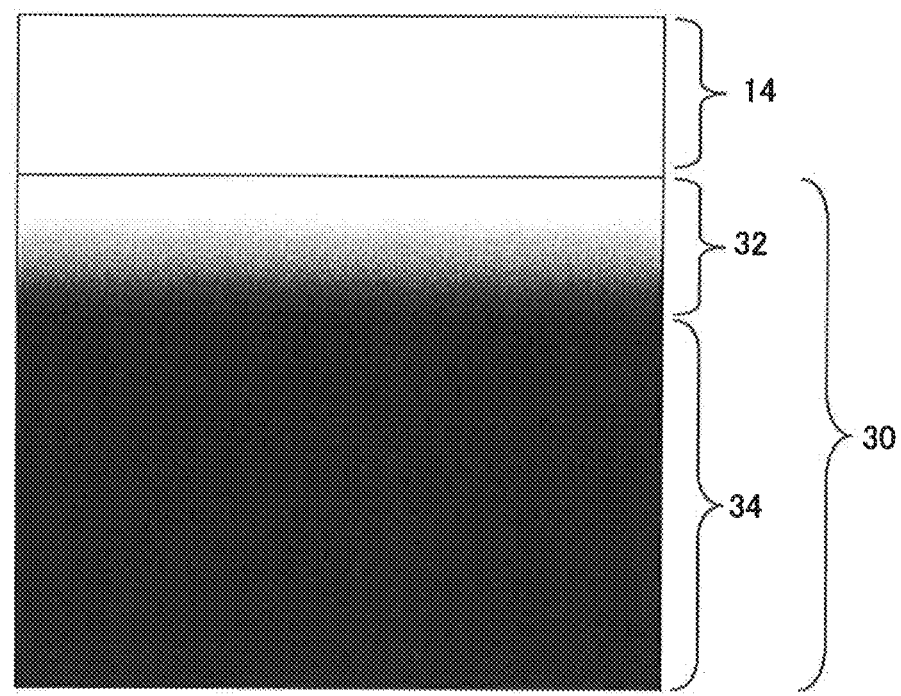
FIG. 4 is a schematic diagram representing a nitrogen density gradient layer and a nitrogen density constant layer, comprised in a SiC grown crystal grown from a seed crystal.

As shown in FIG. 4, a nitrogen density gradient layer is a layer in a grown crystal having a nitrogen density gradient in which the nitrogen density increases substantially in the direction perpendicular to the growth surface of the grown crystal (substantially perpendicular to the bottom face of the seed crystal). A grown crystal may include a nitrogen density constant layer having a substantially constant nitrogen density, in the growth surface side adjacent to the nitrogen density gradient layer.

A nitrogen density constant layer is a layer in a grown crystal, wherein the nitrogen density is substantially constant substantially in the direction perpendicular to the growth surface of the grown crystal (substantially perpendicular to the bottom face of the seed crystal). A nitrogen density constant layer can be formed in the growth surface side adjacent to the nitrogen density gradient layer.

As will be explained in detail below, the nitrogen density in a SiC grown crystal can be controlled by adjusting the nitrogen partial pressure in the atmosphere in the crucible in which the crystal growth is performed. The atmosphere in the crucible during crystal growth may be a mixed gas comprising a prescribed amount of nitrogen gas with an inert gas, such as argon or helium. Before seed touching, the atmosphere in the crucible may be exchanged with argon gas, for example, and after seed touching, nitrogen gas may be mixed therewith to increase the nitrogen partial pressure in the crucible, to increase the nitrogen density in the SiC grown crystal. The temperature of the Si—C solution is preferably controlled to a prescribed high temperature.

From the viewpoint of reducing the density of threading dislocation that can occur in the grown crystal, the rate of change of the nitrogen density in the nitrogen density gradient layer is preferably low. On the other hand, when it is desired to obtain a thick nitrogen density constant layer, a low rate of change of the nitrogen density of the nitrogen density gradient layer will lengthen the total growth time for obtaining the nitrogen density constant layer, and therefore in order to obtain a nitrogen density constant layer with the prescribed thickness within a short growth time, the rate of change of the nitrogen density is preferably not too low. Thus, the lower limit for the rate of change of the nitrogen density in the nitrogen density gradient layer is preferably 20%/mm or greater, more preferably 3000%/mm or greater and even more preferably 6000%/mm or greater, and the upper limit for the rate of change of the nitrogen density in the nitrogen density gradient layer is preferably no greater than 50,000%/mm and more preferably 15,000%/mm.

The rate of change of the nitrogen density can be calculated by the following formula:

$$\text{Rate of change of nitrogen density} = (Y-X)/(X \times T) \times 100$$

(where X is the nitrogen density at initial growth of the nitrogen density gradient layer (the density substantially equal to or near the nitrogen density of the seed crystal), Y is the nitrogen density at the end of grow of the nitrogen density gradient layer (substantially equal to the nitrogen density of the nitrogen density constant layer), and T is the thickness of the nitrogen density gradient layer). The nitrogen density X at initial grow of the nitrogen density gradient layer is preferably close to the nitrogen density of the seed crystal, but it does not need to be equal to the nitrogen density of the seed crystal, and it may be greater than the nitrogen density of the seed crystal within a range such that the threading dislocation density in the grown crystal does not notably exceed the threading dislocation density of the seed crystal. For example, when the target value of the nitrogen density of the nitrogen density constant layer is the same, increasing the nitrogen partial pressure before seed touching within a prescribed range will also increase the nitrogen density X at initial growth of the nitrogen density gradient layer, and will reduce the rate of change of the nitrogen density.

The thickness of the nitrogen density gradient layer can be controlled according to the rate of change of the nitrogen density of the nitrogen density gradient layer, the difference between the nitrogen density of the seed crystal and the target nitrogen density for the nitrogen density constant layer, and the allowable threading dislocation density. The thickness of the nitrogen density gradient layer is preferably 10 to 500 μm and more preferably 30 to 50 μm in order to obtain reduction in the threading dislocation density of the grown crystal, shortening of the growth time and a nitrogen density constant layer having the prescribed thickness, as in the case of the rate of change of the nitrogen density in the nitrogen density gradient layer.

The border between the nitrogen density gradient layer and the nitrogen density constant layer does not need to be clearly distinct. However, the grown crystal grown from the point of seed touching and changing of the nitrogen partial pressure until the prescribed time has elapsed may be considered the nitrogen density gradient layer, and the crystal grown thereafter may be considered as the nitrogen density constant layer, in view of the time from increasing the nitrogen partial pressure in the crucible until the nitrogen dissolves into the Si—C solution. For example, the grown crystal grown from the point of changing the nitrogen partial pressure immediately after seed touching until 30 minutes thereafter may be considered the nitrogen density gradient layer, and the crystal grown from 30 minutes thereafter may be considered the nitrogen density constant layer. Alternatively, a layer with a rate of change of up to 15%/m in the nitrogen density in the growth direction, or a layer with a difference in resistivity in the growth direction within 20% may be considered to be the nitrogen density constant layer.

A low threading dislocation density can be obtained in the grown crystal in the SiC single crystal ingot of the invention, preferably in the nitrogen density constant layer of the grown crystal. The threading dislocation density is preferably $1 \times 10^4$/cm$^2$ or lower, more preferably $7 \times 10^3$/cm$^2$ or lower, even more preferably $5 \times 10^3$/cm$^2$ or lower and yet more preferably $1 \times 10^3$/cm$^2$ or lower.

The grown crystal in the SiC single crystal ingot of the invention may have low resistivity, and in particular a SiC single crystal with low resistivity can be obtained in the nitrogen density constant layer included in the grown crystal. The resistivity of the nitrogen density constant layer is preferably 10 mΩ·cm or lower, more preferably 8 mΩ·cm or lower and even more preferably 6 mΩ·cm or lower.

Preferably, a SiC single crystal having the low threading dislocation density described above and the low resistivity described above can be obtained in the nitrogen density constant layer.

In the grown crystal present in the SiC single crystal ingot of the invention, or at least in the nitrogen density constant layer present in the grown crystal, the lower limit for the nitrogen density is preferably $1 \times 10^{19}$/cm$^3$ or greater and more preferably $2 \times 10^{19}$/cm$^3$ or greater, and the upper limit for the nitrogen density is preferably $2 \times 10^{20}$/cm$^3$ or less and more preferably $6 \times 10^{19}$/cm$^3$ or less. Although a higher nitrogen density can provide lower resistance of the SiC single crystal, an excessively high nitrogen density may increase the threading dislocation density, and therefore the range specified above is preferred.

The thickness of the nitrogen density constant layer can be varied according to the size and thickness of the desired SiC single crystal, but a thicker nitrogen density constant layer is preferred, and it is preferably 0.1 mm or greater, more preferably 1 mm or greater, even more preferably 10 mm or greater and yet more preferably 100 mm or greater.

The resistivity value of the SiC single crystal can be measured by Hall measurement using the Van der Pauw method.

The nitrogen density in the SiC single crystal can be measured using secondary ion mass spectrometry (SIMS). In SIMS, the nitrogen density in the SiC crystal can be measured by mass spectrometry while removing the surface of the SiC crystal by Ar ion sputtering.

The invention also relates to a seed crystal and a SiC single crystal grown from the seed crystal by a solution process. The SiC single crystal has a threading dislocation density of preferably $1 \times 10^4$/cm$^2$ or lower, more preferably $7 \times 10$/cm$^2$ or lower, even more preferably $5 \times 10^3$/cm$^2$ or lower and yet more preferably $1 \times 10^3$/cm$^2$ or lower, and resistivity of preferably 10 mΩ·cm or lower, more preferably 8 mΩ·cm or lower and even more preferably 6 mΩ·cm or lower.

The SiC single crystal can be obtained from a grown crystal comprising the aforementioned nitrogen density gradient layer and nitrogen density constant layer. In that case, the SiC single crystal is a SiC single crystal grown using a seed crystal as the origin by a solution process, wherein the SiC single crystal may comprise a nitrogen density gradient layer in which the nitrogen density increases from the seed crystal side toward the growth surface side, and a nitrogen density constant layer formed in the growth surface side adjacent to the nitrogen density gradient layer. Preferably, the SiC single crystal is obtained from a nitrogen density constant layer.

After growing the SiC single crystal using a seed crystal as the origin, the SiC single crystal can be obtained by cutting off the grown crystal from the Si—C solution and seed crystal, or the SiC single crystal can be obtained by cutting off only the nitrogen density constant layer.

The lower limit for the nitrogen density in the SiC single crystal is preferably $1 \times 10^{19}$/cm$^3$ or higher and more preferably $2 \times 10^{29}$/cm$^3$ or higher, and the upper limit for the nitrogen density is preferably $2 \times 10^{20}$/cm$^3$ or lower and more preferably $6 \times 10^{19}$/cm$^3$ or lower. Although a higher nitrogen density can provide lower resistivity for the SiC single crystal, an excessively high nitrogen density will tend to increase the threading dislocation density, and therefore the range specified above is preferred.

The invention also relates to a method for producing a SiC single crystal by a solution process, wherein a SiC seed crystal is contacted with a Si—C solution having a temperature gradient in which the temperature decreases from the interior toward the surface, in a crucible, to grow a SiC single crystal, wherein the method for producing a SiC single crystal comprises a step of increasing the nitrogen partial pressure in the crucible after contact of the seed crystal with the Si—C solution, to above the nitrogen partial pressure in the crucible before contact of the seed crystal with the Si—C solution.

According to this method it is possible to obtain a SiC single crystal with low threading dislocation density and low resistivity.

A solution process is used in the method for producing a SiC single crystal according to the invention. A solution process for production of a SiC single crystal is a process in which the surface region of the Si—C solution becomes supersaturated due to formation of a temperature gradient in which the temperature decreases from the interior of the Si—C solution toward the surface of the solution in a crucible, and a SiC single crystal is grown on a seed crystal using the seed crystal contacting with the Si—C solution as the origin.

The resistivity of the grown crystal can be controlled by mixing nitrogen gas with the inert atmosphere gas, such as argon gas, to adjust the nitrogen partial pressure of the atmosphere gas in the crucible.

Adjustment of the nitrogen partial pressure may be performed, for example, by introducing a prescribed amount of an inert gas, such as Ar and He, and a prescribed amount of $N_2$ gas, through a gas inlet provided in a water-cooling chamber in the single crystal production apparatus. By increasing the nitrogen partial pressure in the crucible, it is possible to increase the amount of dissolution of nitrogen in the Si—C solution and increase the nitrogen density in the grown crystal.

In this method, the seed crystal is contacted with the Si—C solution, and then the nitrogen partial pressure in the crucible is increased above that before contact of the seed crystal with the Si—C solution. The nitrogen partial pressure is preferably no greater than 5 kPa, more preferably no greater than 2 kPa and even more preferably 0 kPa before contact of the seed crystal with the Si—C solution, and preferably 2 kPa or greater, more preferably 5 kPa or greater and even more preferably 10 kPa or greater after contact of the seed crystal with the Si—C solution, preferably without exceeding 30 kPa.

In order to lower the resistivity of the SiC single crystal formed by the solution process, it has been found to be preferable to increase the nitrogen partial pressure in the atmosphere in the crucible and raise the temperature of the Si—C solution. By increasing the nitrogen partial pressure in the crucible and raising the temperature of the Si—C solution, it is possible to effectively increase the amount of dissolution of nitrogen in the Si—C solution. The amount of dissolution of nitrogen in the Si—C solution can be measured by an inert gas fusion-thermal conductivity method.

In this method, the temperature of the Si—C solution is the surface temperature of the Si—C solution. The temperature at the surface of the Si—C solution is preferably 1950° C. or higher, more preferably 2000° C. or higher and even more preferably 2100° C. or higher. Temperature measurement of the surface of the Si—C solution can be performed using a radiation thermometer, thermocouple or the like.

If the nitrogen partial pressure in the crucible is increased, it is possible to increase the amount of dissolution of nitrogen in the Si—C solution and increase the nitrogen density in the grown crystal. For example, under conditions that a Si—C solution surface temperature is 2100° C. and an atmosphere in the crucible is a mixed gas of argon gas and nitrogen at 1 atmosphere (101 kPa), the nitrogen density in the grown crystal can be about $2\times10^{19}/cm^3$ with a nitrogen partial pressure of 5 kPa (argon partial pressure of 96 kPa), and the nitrogen density in the grown crystal can be about $6\times10^{19}$ to $2\times10^{20}/cm^3$ with a nitrogen partial pressure of 10 kPa to 30 kPa.

If the temperature of the Si—C solution is increased, it is possible to increase the amount of dissolution of nitrogen in the Si—C solution and increase the nitrogen density in the grown crystal. For example, with an atmosphere in the crucible that is a mixed gas of argon gas and nitrogen at 1 atmosphere (101 kPa) and has the nitrogen partial pressure of 10 kPa, a grown crystal with a nitrogen density of about $2\times10^{19}/cm^3$ can be obtained with a Si—C solution surface temperature as low as 1950° C., while a grown crystal, with a nitrogen density of about $6\times10^{19}/cm^3$ can be obtained with a Si—C solution surface temperature as high as 2100° C.

Since threading dislocation can be generated by abrupt variation in the nitrogen density at the border between the seed crystal and the grown crystal, according to this method, at the initial stage of growth, a crystal with a nitrogen density substantially equal to the nitrogen density in the seed crystal is grown. Up until seed touching of the seed crystal with the Si—C solution, therefore, the nitrogen partial pressure in the atmosphere in the crucible is controlled to be preferably no greater than 5 kPa, more preferably no greater than 2 kPa, and even more preferably substantially 0 kPa. Also, since trace amounts of nitrogen source may be present in addition to the atmosphere gas, such as nitrogen gas in the pores of the graphite crucible and nitrogen gas adsorbed onto the heat-insulating material, it is preferred to adjust the nitrogen partial pressure in the atmosphere, in view of the effects of nitrogen from these nitrogen sources, to control the amount of nitrogen to be dissolved in the Si—C solution.

After seed touching of the seed crystal with the Si—C solution, preferably nitrogen is immediately introduced into the crucible so as to obtain the target nitrogen partial pressure. Nitrogen may also be introduced after a prescribed period of time following seed touching, and also after seed touching the nitrogen partial pressure may be increased in a stepwise manner to reach the target nitrogen partial pressure.

In this method it is necessary to increase the amount of nitrogen dissolution in the Si—C solution after seed touching, and for this purpose it is effective to increase the nitrogen partial pressure in the crucible after seed touching, as described above. The amount of dissolution of nitrogen in the Si—C solution during crystal growth is preferably 5 to 15 times, more preferably 8 to 12 times and even more preferably about 10 times the desired nitrogen density of a grown crystal, and for example, it is preferably about $5\times10^{20}/cm^3$. However, due to the time difference from increasing the nitrogen partial pressure in the crucible until the nitrogen dissolves in the Si—C solution, the scope of the invention also includes increasing the nitrogen partial pressure in the crucible simultaneously with seed touching or just before seed touching, in a range such that the amount of nitrogen dissolution in the Si—C solution is increased after seed touching, or in other words, in a range allowing growth of crystals with a nitrogen density substantially equal to the nitrogen density of the seed crystal, at the initial stage of growth.

In this method, a SiC single crystal having quality commonly used for production of SiC single crystals may be used as the seed crystal. For example, a SiC single crystal commonly formed by a sublimation process may be used as the seed crystal. A SiC single crystal commonly formed by such a sublimation process generally contains numerous threading dislocations. The seed crystal to be used for this method may have any desired shape, such as laminar, discoid, cylindrical, columnar, truncated circular conic or truncated pyramidal.

The presence or absence of threading dislocation in the grown crystal can be evaluated by mirror polishing so as to expose the (0001) plane, and performing molten alkali etching using molten potassium hydroxide, sodium peroxide or the like to accentuate the dislocations, and observing the etch pits on the surface of the SiC single crystal with a microscope.

Placement of the seed crystal in the single crystal production apparatus may be done by holding the top face of the seed crystal on the seed crystal holding shaft.

Contact of the seed crystal with the Si—C solution may be performed by lowering the seed crystal holding shaft holding the seed crystal toward the Si—C solution surface, and contacting it with the Si—C solution while the bottom face of the seed crystal is parallel to the Si—C solution surface. The seed crystal may be held at a prescribed position relative to the Si—C solution surface for growth of the SiC single crystal.

The holding position of the seed crystal may be such that the position of the bottom face of the seed crystal matches the Si—C solution surface, is below the Si—C solution surface, or is above the Si—C solution surface. When it is held so that the bottom face of the seed crystal is at a position above the Si—C solution surface, the seed crystal is contacted once with the Si—C solution so that the Si—C solution contacts with the bottom face of the seed crystal, and it is then raised to the prescribed position. The position of the bottom face of the seed crystal may match the Si—C solution surface or be lower than the Si—C solution surface, but it is preferable that the Si—C solution does not contact with the seed crystal holding shaft in order to prevent generation of polycrystals. In such methods, the position of the seed crystal may be adjusted during crystal growth.

The seed crystal holding shaft may be a graphite shaft holding the seed crystal substrate at one end face. The seed crystal holding shaft may have any desired shape, such as cylindrical or columnar, and there may be used a graphite shaft having the same end face shape as the top face of the seed crystal.

According to the invention, a Si—C solution is a solution in which C is dissolved, where the solvent is a molten liquid of Si or Si/X (X is one or more metals other than Si). X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A Si—C solution wherein the solvent is a molten liquid with an atomic composition percentage of Si/Cr/X=30-80/20-60/0-10, has low variation in C dissolution and is therefore preferred. For example, Cr, Ni and the like may be loaded into the crucible in addition to Si, to form a Si—Cr solution, Si—Cr—Ni solution or the like.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising tungsten-rhenium wire covered with zirconia or magnesia glass, placed inside a graphite protection tube.

FIG. 1 shows an example of a SiC single crystal production apparatus suitable for carrying out the method of the invention. The illustrated SiC single crystal production device 100 comprises a crucible 10, wherein the crucible 10 receives a Si—C solution 24 having C dissolved in a molten liquid of Si or Si/X, a temperature gradient is formed in which the temperature is decreased from the interior of the Si—C solution toward the surface of the solution, and the seed crystal substrate 14 that is held at the tip of the vertically movable graphite shaft 12 is contacted with the Si—C solution 24 to allow growth of the SiC single crystal. The crucible 10 and the graphite shaft 12 are preferably rotated.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B can be independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow adjustment of the nitrogen partial pressure in the apparatus and in the crucible using Ar, He, $N_2$ or the like.

The temperature of the Si—C solution usually has a temperature distribution with a lower temperature at the surface of the Si—C solution than the interior thereof due to thermal radiation and the like. Further, a prescribed temperature gradient can be formed in the Si—C solution 24 in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil. For example, the output of the upper level coil 22A may be smaller than the output of the lower level coil 22B, to form a prescribed temperature gradient in the Si—C solution 24 in which an upper portion of the solution is at low temperature and a lower portion of the solution is at high temperature.

The C dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the upper level and lower level of the coil 22, heat radiation from the surface of the Si—C solution, and heat loss through the graphite shaft 12. When the C dissolved in the lower part of the solution where the temperature and the solubility are high, reaches the region near the bottom face of the seed crystal substrate where the temperature and the solubility are low, a supersaturated state appears and a SiC single crystal is grown on the seed crystal substrate by virtue of supersaturation as a driving force.

In some embodiments, meltback may be carried out in which the surface layer of the SiC seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on processed conditions of the surface of a SiC crystal substrate, it is preferably about 5 to 50 m for sufficient removal of an affected layer and a natural oxide film.

The meltback may be performed by forming in the Si—C solution a temperature gradient in which the temperature increases from the interior of the Si—C solution toward the surface of the solution, i.e., by forming a temperature gradient in a direction opposite to the case of SiC single crystal growth. The temperature gradient in the opposite direction can be formed by controlling the output of the high-frequency coil.

The meltback can also be performed, without forming a temperature gradient in the Si—C solution, by simply immersing the seed crystal substrate in the Si—C solution heated to a temperature higher than the liquidus temperature. In that case, the dissolution rate increases with higher Si—C solution temperature, but control of the amount of dissolution becomes difficult, while a low temperature may slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the graphite shaft. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

EXAMPLES

Example 1

There was prepared a SiC single crystal formed by a sublimation process, which was a discoid 4H—SiC single crystal with a diameter of 12 mm, a thickness of 700 μm, and the bottom face as the (0001) plane, for use as a seed crystal substrate. The seed crystal substrate had a threading dislocation density of $7\times10^3/cm^2$, a resistivity of 20 mΩ·cm and a nitrogen density of $1\times10^{19}/cm^3$. The top face of the seed crystal substrate was bonded to roughly the center section of the end face of a cylindrical graphite shaft, using a graphite adhesive.

A single crystal production apparatus as shown in FIG. 1 was used, and Si/Cr/Ni was loaded as a molten liquid starting material into a graphite crucible for housing a Si—C solution. Vacuum suction of the interior of the single crystal production apparatus was performed down to $1\times10^{-3}$ Pa and argon gas was then introduced into the single crystal production apparatus up to 91 kPa so that the air inside the single crystal production apparatus was exchanged with argon to control the nitrogen partial pressure to 0 kPa. The high-frequency coil was electrified to melt the starting material in the graphite crucible by heating, thereby forming a Si/Cr/Ni alloy molten liquid. Then, a sufficient amount of C was dissolved into the Si/Cr/Ni alloy molten liquid from the graphite crucible to form a Si—C solution.

The outputs of the upper level coil and lower level coil were adjusted to heat the graphite crucible so that the temperature on the surface of the Si—C solution was increased to 2100° C., and a temperature gradient in which the temperature decreased from the solution interior in a range of 10 mm from the solution surface, toward the solution surface, was 5° C./cm. Temperature measurement of the surface of the Si—C solution was performed with a radiation thermometer, and measurement of the temperature gradient of the Si—C solution was performed by using a vertically movable thermocouple.

Seed touching was performed by placing the bottom face of the seed crystal at a position matching the liquid surface of the Si—C solution to contact the bottom face of the seed crystal with the Si—C solution, while keeping the bottom face of the seed crystal bonded to the graphite shaft parallel to the Si—C solution surface. The graphite shaft was then raised 1.5 mm to prevent the Si—C solution from wetting up and contacting the graphite shaft. Immediately after seed touching, nitrogen gas was introduced into the single crystal production apparatus, and the argon gas partial pressure was controlled to 91 kPa and the nitrogen partial pressure to 10 kPa in the crucible, maintaining the 1.5 mm-raised position for 10 hours to grow a crystal.

Upon completion of the crystal growth, the graphite shaft was raised, and the seed crystal and the SiC crystal grown from the seed crystal were severed from the Si—C solution and the graphite shaft and were recovered. The obtained grown crystal was a SiC single crystal having a diameter of 12 mm and a thickness of 1 mm, of which the nitrogen density gradient layer constituted a thickness of 30 μm and the nitrogen density constant layer constituted a thickness of 0.97 mm.

Figure 2:
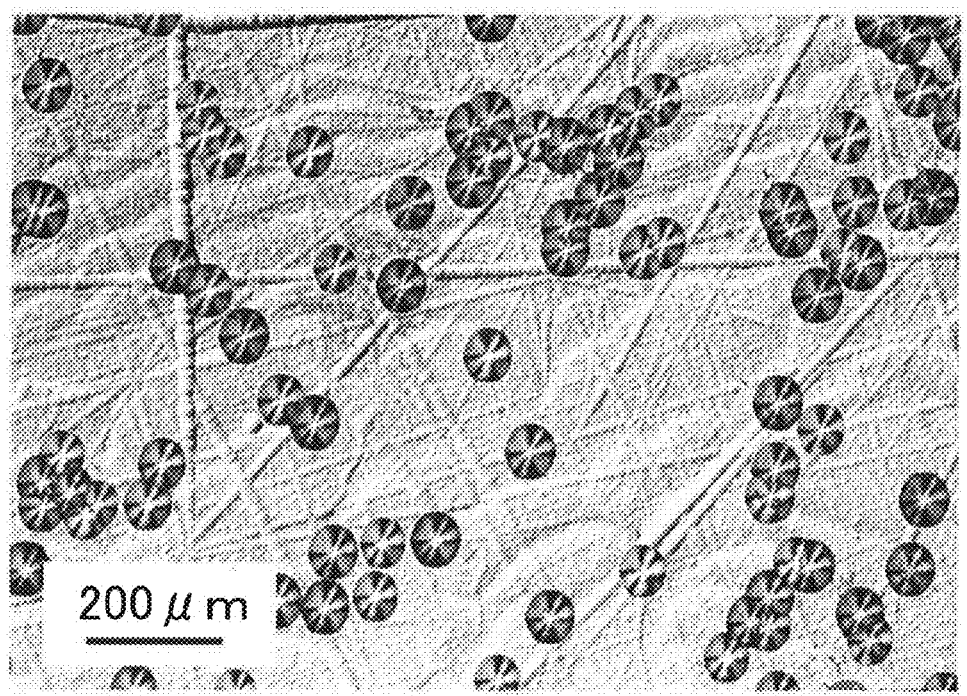
FIG. 2 is a photomicrograph of an etching surface after mirror polishing and molten alkali etching, on the (0001) plane of a crystal grown according to the invention.

The obtained grown crystal was cut out from the growth surface to a thickness of 0.5 mm, and the (0001) plane of the cut out grown crystal was mirror polished and subjected to alkali etching using molten KOH at 510° C. The etching surface was observed with a microscope. FIG. 2 shows a photomicrograph of the etching surface. The number of etch pits seen in FIG. 2 were counted, and the threading dislocation density of the grown crystal was measured. The threading dislocation density of the nitrogen density constant layer obtained in this example was $7\times10^3/cm^2$. No micropipe defects were present in the nitrogen density constant layer.

In order to measure the resistivity of the nitrogen density constant layer in the obtained grown crystal, the (0001) plane of the threading dislocation-measured grown crystal was further mirror polished, processed to a 5 mm square, and cleaned, and then circular Ni ohmic electrodes with a diameter of 1 mm were formed by vacuum vapor deposition on the four corners of the (0001) plane. The grown crystal with the electrodes was used for Hall measurement by the Van der Pauw method at room temperature (25° C.), and measurement of the resistivity of the grown crystal revealed resistivity of 6 mΩ·cm.

The nitrogen density of the nitrogen density constant layer was measured by secondary ion mass spectrometry (SIMS). The nitrogen density in the SiC crystal was measured by mass spectrometry of SIMS while performing Ar ion sputtering of the polished surface of the (0001) plane of the nitrogen density constant layer by using SIMS to remove the (0001) plane surface. The nitrogen density of the nitrogen density constant layer was $6 \times 10^{19}/cm^3$, and the rate of change of the nitrogen density of the nitrogen density gradient layer was 15,000%/mm.

Example 2

A crystal was grown and recovered under the same conditions as Example 1, except that an argon partial pressure and a nitrogen partial pressure before seed touching were controlled to 91 kPa and 2 kPa, respectively. The threading dislocation density, resistivity and nitrogen density of the grown crystal were then measured under the same conditions as Example 1.

The obtained grown crystal was a SiC single crystal having a diameter of 12 mm and a thickness of 1 mm, of which the nitrogen density gradient layer constituted a thickness of 30 μm and the nitrogen density constant layer constituted a thickness of 0.97 mm. The threading dislocation density of the nitrogen density constant layer was $7 \times 10^3/cm^2$, and the resistivity was 6 mΩ·cm. The nitrogen density of the nitrogen density constant layer was $6 \times 10^{19}/cm^3$, and the rate of change of the nitrogen density of the nitrogen density gradient layer was 6000%/mm. No micropipe defects were present in the grown crystal.

Example 3

A crystal was grown and recovered under the same conditions as Example 1, except that an argon partial pressure and a nitrogen partial pressure before seed touching were controlled to 91 kPa and 5 kPa, respectively. The threading dislocation density, resistivity and nitrogen density of the grown crystal were then measured under the same conditions as Example 1.

The obtained grown crystal was a SiC single crystal having a diameter of 12 mm and a thickness of 1 mm, of which the nitrogen density gradient layer constituted a thickness of 30 m and the nitrogen density constant layer constituted a thickness of 0.97 mm. The threading dislocation density of the nitrogen density constant layer was $7 \times 10^3/cm^2$, and the resistivity was 6 mΩ·cm. The nitrogen density of the nitrogen density constant layer was $6 \times 10^{19}/cm^3$, and the rate of change of the nitrogen density of the nitrogen density gradient layer was 3000%/mm. No micropipe defects were present in the grown crystal.

Example 4

A crystal was grown and recovered under the same conditions as Example 1, except for controlling the crystal growth temperature to 19500° C. The threading dislocation density, resistivity and nitrogen density of the grown crystal were then measured under the same conditions as Example 1.

The obtained grown crystal was a SiC single crystal having a diameter of 12 mm and a thickness of 1 mm, of which the nitrogen density gradient layer constituted a thickness of 30 μm and the nitrogen density constant layer constituted a thickness of 0.97 mm. The threading dislocation density of the nitrogen density constant layer was $7 \times 10^3/cm^3$, and the resistivity was 10 mΩ·cm. The nitrogen density of the nitrogen density constant layer was $2 \times 10^{19}/cm^3$, and the rate of change of the nitrogen density of the nitrogen density gradient layer was 3000%/mm. No micropipe defects were present in the grown crystal.

Comparative Example 1

Figure 3:
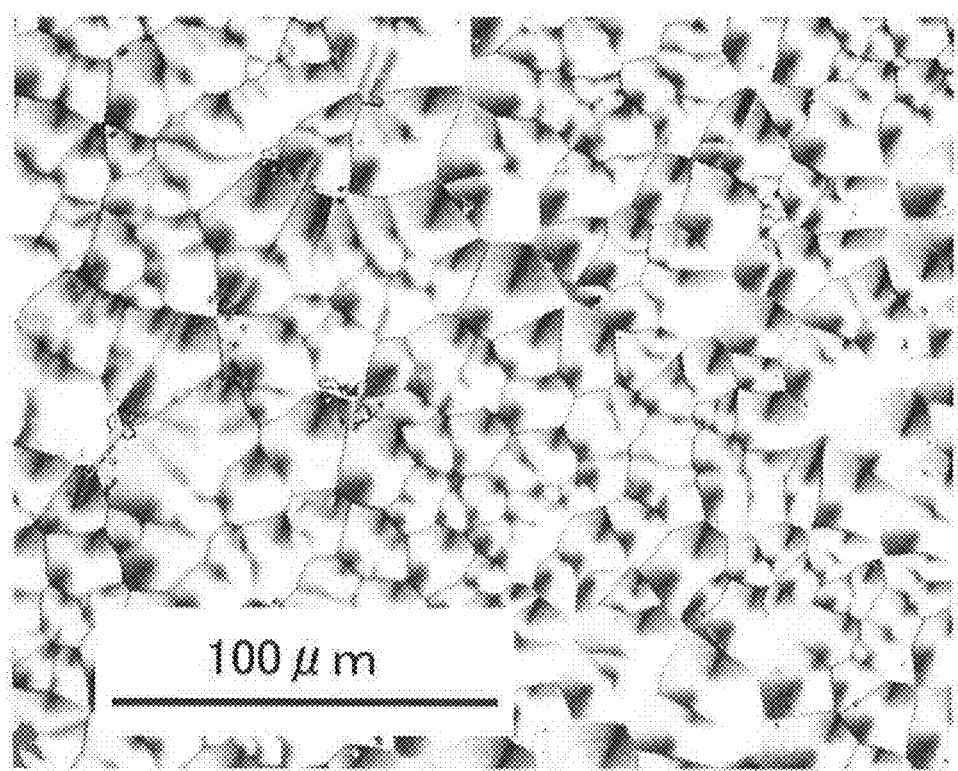
FIG. 3 is a photomicrograph of an etching surface after mirror polishing and molten alkali etching, on the (0001) plane of a crystal grown according to the prior art.

A crystal was grown and recovered under the same conditions as Example 1, except that an argon partial pressure and a nitrogen partial pressure before seed touching were controlled to 91 kPa and 10 kPa, respectively, and the partial pressure was not changed after seed touching. The threading dislocation density, resistivity and nitrogen density of the grown crystal were then measured under the same conditions as Example 1. FIG. 3 shows a photomicrograph of the alkali-etched (0001) plane. Numerous etch pits were seen over the entirety.

The obtained grown crystal was a SiC single crystal having a diameter of 12 mm and a thickness of 1 mm, of which no nitrogen density gradient layer had been formed, and the nitrogen density constant layer constituted a thickness of 1.000 mm. The threading dislocation density of the nitrogen density constant layer was $1 \times 10^6/cm^2$, and the resistivity was 6 mΩ·cm. The nitrogen density of the nitrogen density constant layer obtained in this example was $6 \times 10^{19}/cm^3$. No micropipe defects were present in the grown crystal.

Table I shows the growth conditions, and the threading dislocation density and resistivity of the nitrogen density constant layer, the nitrogen density of the nitrogen density constant layer, and the rate of change of the nitrogen density of the nitrogen density gradient layer, for Examples 1 to 4 and Comparative Example 1.

TABLE 1

| | Growth conditions | | | Properties of grown crystal | | | |
|---|---|---|---|---|---|---|---|
| | Nitrogen partial pressure before seed touching (kPa) | Nitrogen partial pressure after seed touching (kPa) | Growth temperature (° C.) | Threading dislocation density (/cm$^2$) | Resistivity (mΩ · cm) | Nitrogen density (/cm$^3$) | Nitrogen density variation (%/um) |
| Example 1 | 0 | 10 | 2100 | $7 \times 10^3$ | 6 | $6 \times 10^{19}$ | 15000 |
| Example 2 | 2 | 10 | 2100 | $7 \times 10^3$ | 6 | $6 \times 10^{19}$ | 6000 |
| Example 3 | 5 | 10 | 2100 | $7 \times 10^3$ | 6 | $6 \times 10^{19}$ | 3000 |
| Example 4 | 0 | 10 | 1950 | $7 \times 10^3$ | 10 | $2 \times 10^{19}$ | 3000 |
| Comp. Ex. 1 | 10 | 10 | 2100 | $1 \times 10^6$ | 6 | $6 \times 10^{19}$ | — |

In a nitrogen partial pressure range of up to 5 kPa before seed touching, no increase in threading dislocation density was seen, and a SiC single crystal with low threading dislocation density and low resistivity was obtained.

EXPLANATION OF SYMBOLS

100 Single crystal production apparatus
10 Graphite crucible
12 Graphite shaft
14 Seed crystal substrate
18 Heat-insulating material
22 High-frequency coil
22A Upper level high-frequency coil
22B Lower level high-frequency coil
24 Si—C solution
26 Quartz tube
30 SiC grown single crystal
32 Nitrogen density gradient layer
34 Nitrogen density constant layer

What is claimed is:

1. A SiC single crystal ingot comprising a seed crystal and a grown crystal grown from the seed crystal by a solution process,
    wherein the grown crystal contains a nitrogen density gradient layer in which the nitrogen content increases in the direction of growth from the seed crystal, and a nitrogen density constant layer in the growth surface side adjacent to the nitrogen density gradient layer, and
    wherein the nitrogen density constant layer has a total dislocation density of threading screw dislocation and threading edge dislocation of $7\times10^3/cm^2$ or less, and the nitrogen density constant layer does not comprise micropipe defects, and
    wherein the rate of change of the nitrogen density in the nitrogen density gradient layer is 3,000%/mm or greater and no greater than 50,000%/mm.

2. The SiC single crystal ingot according to claim 1, wherein the resistivity of the nitrogen density constant layer is 10 mΩ·cm or lower.

3. The SiC single crystal ingot according to claim 1, wherein the nitrogen density of the nitrogen density constant layer is $2\times10^{19}$ to $2\times10^{20}/cm^3$.

4. A method for making the SiC single crystal ingot of claim 1, comprising:
    producing a SiC single crystal by a solution process, wherein a SiC seed crystal is contacted with a Si—C solution having a temperature gradient in which the temperature decreases from the interior toward the surface, in a crucible, to grow a SiC single crystal,
    wherein the producing comprises increasing the nitrogen partial pressure in the crucible after contact of the seed crystal with the Si—C solution, to above the nitrogen partial pressure in the crucible before contact of the seed crystal with the Si—C solution, to grow a nitrogen density gradient layer in which the nitrogen content increases in the direction of growth from the seed crystal, and a nitrogen density constant layer in the growth surface side adjacent to the nitrogen density gradient layer.

5. The method for making the SiC single crystal according to claim 4, wherein the surface temperature of the Si—C solution is 2100° C. or higher.

6. The method for making the SiC single crystal according to claim 4, wherein the nitrogen partial pressure in the crucible is no greater than 5 kPa before the seed crystal is contacted with the Si—C solution, and the nitrogen partial pressure in the crucible is 10 kPa to 30 kPa after the seed crystal is contacted with the Si—C solution.

* * * * *